United States Patent
Sugimoto et al.

(10) Patent No.: US 9,711,262 B2
(45) Date of Patent: Jul. 18, 2017

(54) COMPOUND SUPERCONDUCTING WIRE AND METHOD FOR MANUFACTURING THE SAME

(71) Applicants: FURUKAWA ELECTRIC CO., LTD., Tokyo (JP); TOHOKU UNIVERSITY, Miyagi (JP)

(72) Inventors: Masahiro Sugimoto, Tokyo (JP); Hirokazu Tsubouchi, Tokyo (JP); Kazuo Watanabe, Miyagi (JP); Satoshi Awaji, Miyagi (JP); Hidetoshi Oguro, Miyagi (JP)

(73) Assignee: TOHOKU TECHNO ARCH CO., LTD., Miyagi (JP)

( * ) Notice: Subject to any disclaimer, the term of this patent is extended or adjusted under 35 U.S.C. 154(b) by 371 days.

(21) Appl. No.: 14/510,973

(22) Filed: Oct. 9, 2014

(65) Prior Publication Data
US 2015/0024943 A1    Jan. 22, 2015

Related U.S. Application Data

(63) Continuation of application No. PCT/JP2013/061078, filed on Apr. 12, 2013.

(30) Foreign Application Priority Data

Apr. 12, 2012   (JP) .................. 2012-090829

(51) Int. Cl.
*H01B 12/00*   (2006.01)
*H01L 39/14*   (2006.01)
(Continued)

(52) U.S. Cl.
CPC ............ *H01B 12/08* (2013.01); *B21C 1/003* (2013.01); *C22C 9/00* (2013.01); *C22C 9/02* (2013.01);
(Continued)

(58) Field of Classification Search
CPC ............ H01B 13/0026; H01L 39/14–39/2406
See application file for complete search history.

(56) References Cited

U.S. PATENT DOCUMENTS 3,665,595 A * 5/1972 Tanaka .................... H01F 6/06
                                                              29/599
3,686,750 A * 8/1972 Woolcock .............. H01B 12/10
                                                              174/125.1
(Continued)

FOREIGN PATENT DOCUMENTS

EP          2099080        9/2009
JP          S60-198009     10/1985
(Continued)

OTHER PUBLICATIONS

Machine translation of JP2007-305503, pp. 1-7, printed Nov. 30, 2016.*

(Continued)

*Primary Examiner* — Colleen Dunn
(74) *Attorney, Agent, or Firm* — Amin, Turocy & Watson, LLP

(57) ABSTRACT

A compound superconducting wire 10 includes a reinforcement portion 12 and a compound superconductor 11. In the reinforcement portion 12, an assembly of plural reinforcement elements 4 are disposed. The reinforcement elements 4 each include plural reinforcement filaments 1 disposed in a stabilizer 2, and a stabilizing layer 3 at the outer periphery thereof. The reinforcement filaments 1 each mainly contain one or more metals selected from the group consisting of Nb, Ta, V, W, Mo, Fe, and Hf, an alloy consisting of two or more metals selected from the aforementioned group, or an alloy consisting of copper and one or more metals selected from the aforementioned group.

10 Claims, 8 Drawing Sheets

(51) Int. Cl.
*H01B 12/08* (2006.01)
*H01L 39/24* (2006.01)
*C22C 9/00* (2006.01)
*C22C 9/02* (2006.01)
*C22C 27/02* (2006.01)
*H01B 13/00* (2006.01)
*B21C 1/00* (2006.01)

(52) U.S. Cl.
CPC ......... *C22C 27/02* (2013.01); *H01B 13/0026* (2013.01); *H01L 39/14* (2013.01); *H01L 39/2403* (2013.01); *H01L 39/2406* (2013.01); *Y10T 29/49014* (2015.01); *Y10T 428/12438* (2015.01); *Y10T 428/12444* (2015.01); *Y10T 428/12778* (2015.01); *Y10T 428/12819* (2015.01)

(56) References Cited

U.S. PATENT DOCUMENTS

| | | | | |
|---|---|---|---|---|
| 3,983,521 | A * | 9/1976 | Furuto | H01L 39/14 174/125.1 |
| 4,329,539 | A * | 5/1982 | Tanaka | H01B 12/02 174/125.1 |
| 5,200,577 | A * | 4/1993 | Shimada | H01L 39/2403 174/125.1 |
| 2003/0045433 | A1 | 3/2003 | Iwaki | |
| 2008/0167192 | A1 | 7/2008 | Kato et al. | |
| 2010/0031494 | A1 | 2/2010 | Motowidlo | |

FOREIGN PATENT DOCUMENTS

| | | |
|---|---|---|
| JP | H5-217433 | 8/1993 |
| JP | 10-321058 | 12/1998 |
| JP | 2001-57118 | 2/2001 |
| JP | 2003-045247 | 2/2003 |
| JP | 2003-086032 | 3/2003 |
| JP | 2007-081128 | 3/2007 |
| JP | 2007-305503 | 11/2007 |
| JP | 2008-047386 | 2/2008 |
| JP | 2008-300337 | 12/2008 |
| JP | 2009-059652 | 3/2009 |

OTHER PUBLICATIONS

Extended European Search Report dated Dec. 17, 2015 for European Patent Application No. 13775474.3, 8 pages.

M.Liang et al., "Characteristics of High Strength and High Conductivity Cu—Nb Micro-Composites", IEEE Transactions on Applied Superconductivity, vol. 20 No. 3, pp. 1619-1621, Jun. 2010.

Marcello Filgueira et al., "Mechanical Behaviour of Copper 15% Volume Niobium Microcomposite Wires", Materials Research, vol. 4 No. 2, pp. 127-131, Apr. 2001.

International Search Report for PCT Application Serial No. PCT/JP2013/061078, mailed Jun. 18, 2013, 4 pages.

* cited by examiner

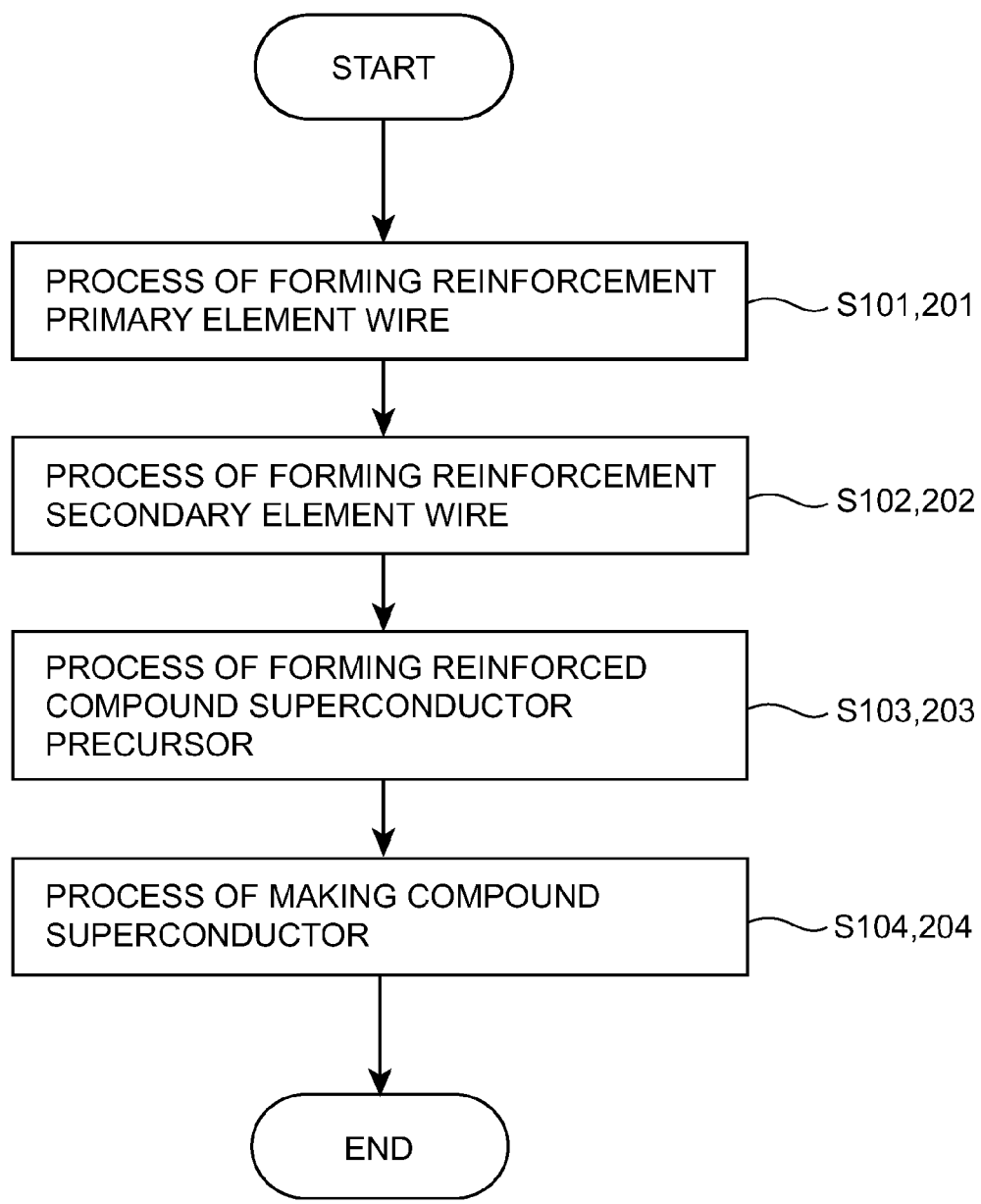

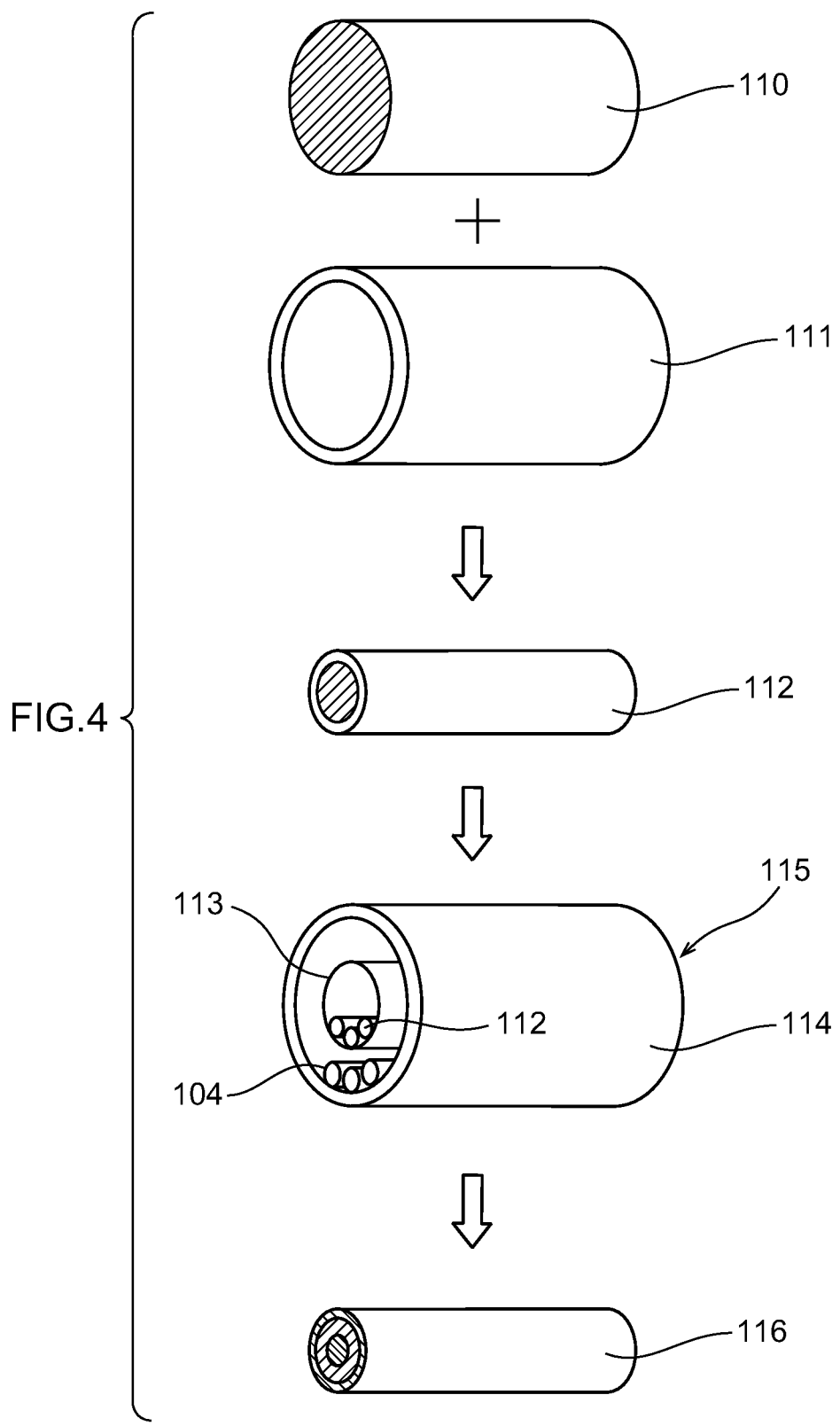

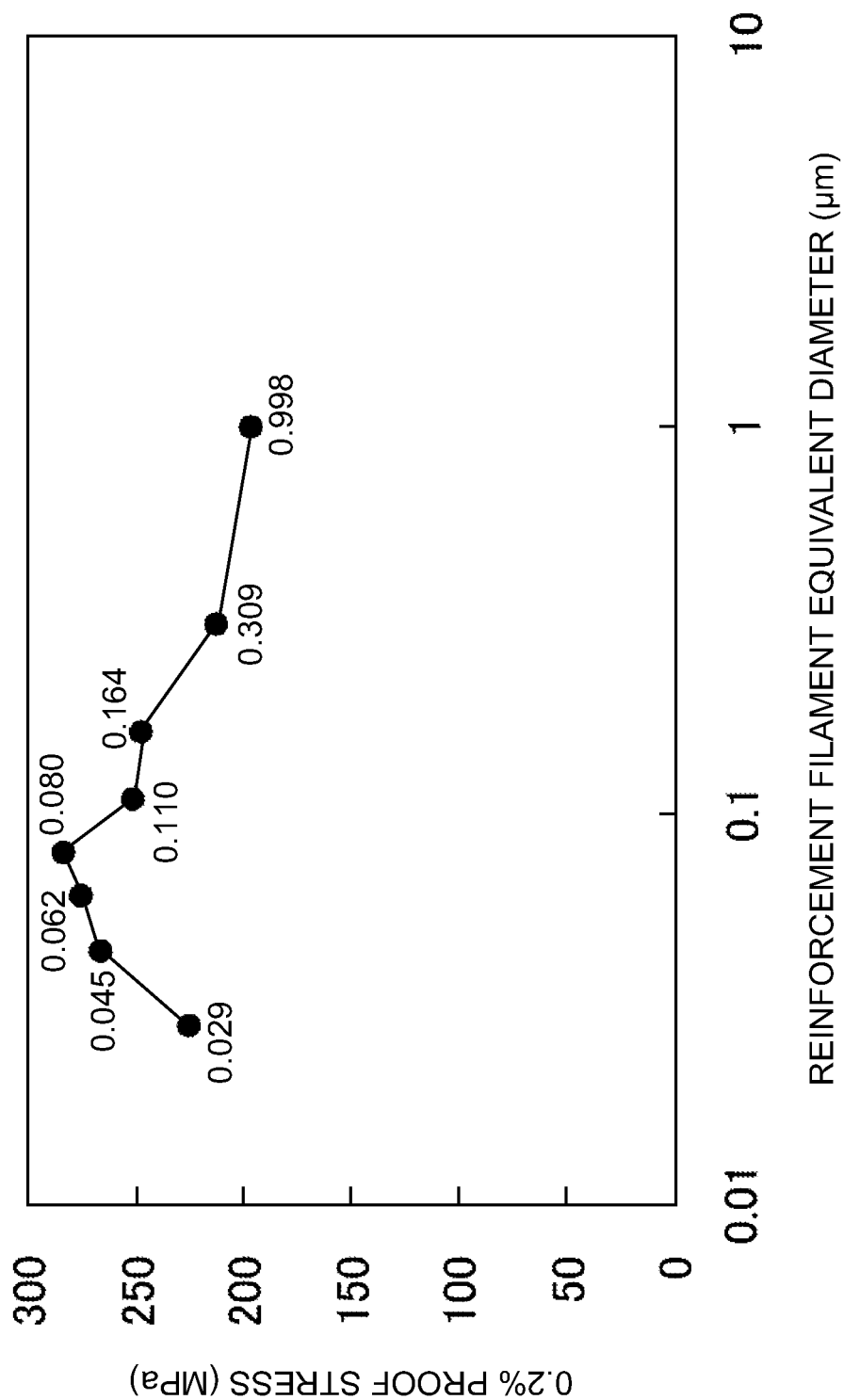

COMPOUND SUPERCONDUCTING WIRE AND METHOD FOR MANUFACTURING THE SAME

CROSS-REFERENCE TO RELATED APPLICATIONS

This application is a continuation application of International Application No. PCT/JP2013/061078, filed Apr. 12, 2013, the disclosure of which is incorporated herein by reference in its entirety. Further, this application claims priority from Japanese Patent Application No. 2012-090829, filed Apr. 12, 2012, the disclosure of which is incorporated herein by reference in its entirety.

TECHNICAL FIELD

Present invention relates to a compound superconducting wire, and in particular to a high strength compound superconducting wire applicable to superconducting magnets, and a manufacturing method thereof.

BACKGROUND ART

Superconducting wires applied to superconducting magnets employed for strong magnetic fields and to superconductors employed in nuclear fusion reactors are subject to electromagnetic force during conduction, and large strains are imparted to the superconducting wires during cooling. In particular, a superconducting wire with a twisted wire structure, in which plural element wires are twisted together, is sometimes imparted with not only tensile stress in the element wire length direction, but also with a complicated strain such as strain in the compression direction and strain in bending directions. There is a need for achieving higher strength of a superconducting wire in order to suppress a drop in superconducting characteristics of the superconducting wire even in a state imparted with such strain.

In order to achieve higher strength of a compound superconducting wire, there are a method of compositing a high strength material within a superconducting wire, and a method of assembling a superconducting wire and a member consisting of a high strength material.

As a method of compositing a high strength material within a superconducting wire, there is a method, as described in Japanese Patent Application Laid-Open (JP-A) No. 2001-57118, in which, out of compound superconducting wires, an $Nb_3Sn$ superconducting wire containing an $Nb_3Sn$ superconductor is formed into a reinforced $Nb_3Sn$ superconducting wire by using a reinforcement consisting of a CuNb alloy formed by an in-situ method. Moreover, as described in JP-A No. 2008-300337, there is a known method of forming a high strength superconducting wire by using a method of compositing a reinforcement element wire, in which Ti as a rod shaped reinforcement member is embedded in Cu, and an internal diffusion method element wire in an $Nb_3Sn$ superconducting wire formed by an internal diffusion method.

As a method of assembling a superconducting wire and a member consisting of a high strength material, there is a known method, as described in JP-A No. H05-217433, in which a superconducting wire and stainless steel are assembled together.

However, the superconducting wires including the reinforcement consisting of a CuNb alloy formed with Cu by an in-situ method as in JP-A No. 2001-57118, have the problems of lacking uniformity in the length direction, being liable to wire breakage during processing, and the residual resistivity ratio of the reinforcement portion becoming smaller. Thus, in cases in which attempts are made to employ a superconducting wire using a reinforcement consisting of CuNb alloy formed by an in-situ method in a superconducting magnet employed for strong magnetic fields, there is a need to increase the amount of copper wire composited with the superconducting wire in order to secure conduction stability, and as a result there is the problem that the current density per superconducting wire falls. Moreover, in cases in which a Cu/Ti composite reinforcement is employed as in JP-A No. 2008-300337, since the Ti reacts with the Cu to form a Cu—Ti based compound, the Cu/Ti composite reinforcement is weak to bending strain, and has insufficient performance as a high strength material. Moreover, when avoiding the formation of the metal compound, an Nb layer needs to be formed between the Ti and Cu, and there is a problem in that the process is more complicated in which a three-layered reinforcement element wire is formed.

In the assembly method of superconducting wire and stainless steel as described in JP-A No. H05-217433, the performance as a stabilizer is lowered due to the high resistance value of the stainless steel, with problems with stability during conducting.

SUMMARY OF INVENTION

Present invention provides a compound superconducting wire having high strength and stability during conducting, and a manufacturing method thereof.

The compound superconducting wire according to the present invention includes: a reinforcement portion including plural reinforcement elements that each include a reinforcement bundle consisting of plural reinforcement filaments and a stabilizer mainly containing copper or a copper alloy and formed at the outer periphery of each of the reinforcement filaments, the reinforcement filaments each mainly containing one or more metals selected from the group consisting of Nb, Ta, V, W, Mo, Fe, and Hf, an alloy consisting of two or more metals selected from the aforementioned group, or an alloy consisting of copper and one or more metals selected from the aforementioned group, and a stabilizing layer mainly containing copper or a copper alloy at the outer periphery of the reinforcement bundle; and a compound superconductor.

In such a configuration, the compound superconductor may be a metal compound superconductor; and the compound superconducting wire may include a reinforced compound superconducting element wire including a reinforced superconducting element in which the reinforcement portion and the compound superconductor are composited into a single wire shape, and a stabilizing outermost layer mainly containing copper or a copper alloy and formed at the outer periphery of the reinforced superconducting element.

The equivalent diameter of the reinforcement filaments is preferably 0.3 μm or less, and more preferably from 0.04 μm to 0.16 μm. The reinforcement filaments preferably mainly contain one or more metals selected from the group consisting of Nb, Ta, and V. Moreover, the volume occupancy ratio of the reinforcement filaments in the reinforcement element is preferably from 10% to 50%.

The compound superconducting wire according to the invention may be in the form in which a reinforcement wire including the reinforcement portion and a compound superconducting element wire including the compound superconductor are twisted together. The compound superconducting wire according to the invention may be in the form in which a reinforcement wire including the reinforcement portion and the reinforced compound superconducting element wire are twisted together.

Moreover, in a manufacturing method of a compound superconducting wire according to the invention, the method includes: a process of forming a reinforcement primary element wire by performing wire drawing on a reinforcement primary precursor formed by inserting a reinforcement element rod, mainly containing one or more metals selected from the group consisting of Nb, Ta, Ti, W, Mo, and Hf, an alloy consisting of two or more metals selected from the aforementioned group, or an alloy consisting of copper and one or more metals selected from the aforementioned group, into a primary stabilization tube mainly containing copper or a copper alloy; a process of forming a reinforcement secondary element wire by performing wire drawing on a reinforcement secondary precursor formed by inserting the plural reinforcement primary element wires into a secondary stabilization tube mainly containing copper or a copper alloy; a process of forming a reinforced compound superconductor precursor by compositing a compound superconductor precursor for forming a compound superconductor and the plural reinforcement secondary element wires; and a process of making a compound superconductor by heat treating the reinforced compound superconductor precursor.

The reinforced compound superconductor precursor may have a structure in which the compound superconductor precursor and the plural reinforcement secondary element wires are inserted into an outermost layer stabilization tube mainly containing copper or a copper alloy, and the reinforced compound superconductor precursor may have a structure in which the compound superconductor precursor and a reinforcement wire precursor including the plural reinforcement secondary element wires are twisted together.

According to the invention, a reinforcement member having high strength and a high residual resistivity ratio can be formed, enabling a compound superconducting wire having stability during conduction to be obtained.

BRIEF DESCRIPTION OF DRAWINGS

FIG. 2 illustrates a manufacturing process flow for a compound superconducting wire of the invention.

FIG. 4 is a process diagram of a reinforced compound superconductor precursor for forming a compound superconducting wire of the invention.

FIG. 7 is a graph indicating a relationship between a 0.2% proof stress and an equivalent diameter of reinforcement filaments formed in a reinforcement portion of the invention.

DESCRIPTION OF EMBODIMENTS

Figure 1:
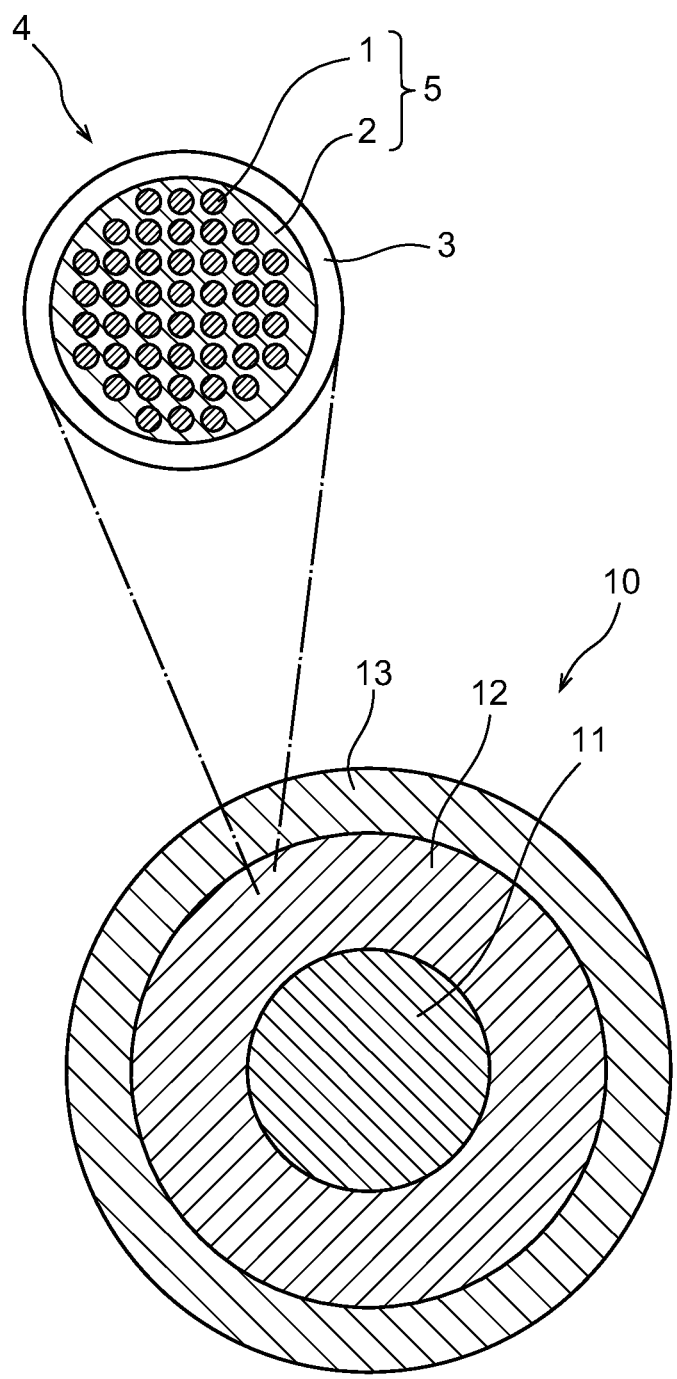
FIG. 1 is a diagram illustrating a cross-section structure of a compound superconducting wire according to an exemplary embodiment of the invention.

Detailed explanation follows regarding a reinforced compound superconducting wire of embodiment of the invention and a manufacturing method thereof, with reference to the drawings. Note that in the drawings, members (configuration elements) that have the same or corresponding function are allocated the same reference numerals, and explanation thereof is omitted as appropriate.

FIG. 1 is a diagram illustrating a cross-section structure of a compound superconducting wire 10 according to an exemplary embodiment of the invention. In the compound superconducting wire 10, a reinforcement portion 12 is placed at the periphery of a compound superconductor 11, and a stabilizing outermost layer 13 is formed around the outer periphery of the reinforcement portion 12. In the reinforcement portion 12, an assembly of plural reinforcement elements 4 is disposed, each reinforcement element 4 including a reinforcement bundle 5, formed by disposing plural reinforcement filaments 1 in a stabilizer 2, and a stabilizing layer 3 at the outer periphery of the reinforcement bundle 5. A further improvement in the stability during conducting can be achieved by forming the stabilizing outermost layer 13 at the outer periphery of the reinforcement portion 12.

The reinforcement filaments 1 can be formed mainly containing one or more metals selected from the group consisting of Nb, Ta, V, W, Mo, Fe, and Hf, an alloy consisting of two or more metals selected from the aforementioned group, or an alloy consisting of copper and one or more metals selected from the aforementioned group. "Mainly containing" for the reinforcement filaments 1 indicates that the reinforcement filaments may contain unavoidable impurities.

In an example, in cases in which the reinforcement filaments 1 mainly contain Nb, sometimes unavoidable impurities are contained such as, for example, O: 150 ppm or lower, H: 15 ppm or lower, C: 100 ppm or lower, N: 100 ppm or lower, Fe: 50 ppm or lower, Ni: 50 ppm or lower, Ti: 20 ppm or lower, Si: 50 ppm or lower, W: 300 ppm or lower, and Ta: 1000 ppm or lower. In cases in which the reinforcement filaments 1 mainly contain Ta, unavoidable impurities are sometimes included such as O, H, C, N, Fe, Ni, Ti, Si, W, Nb, and Mo, and in cases in which the reinforcement filaments 1 mainly contain V, unavoidable impurities are sometimes included such as Fe and Al.

With regard to these single metals or alloys, since the metals or alloys configuring the reinforcement filaments 1 do not readily form a solid solution with Cu during the heat treatment employed to form a compound superconductor, they do not readily form compounds with Cu, and effectively contribute to raising the bending strain characteristics. For example, in cases in which a compound superconducting wire is employed that is composited with reinforcement including Ti, a metal that forms a solid solution with Cu, a Cu—Ti compound (intermetallic compound) is formed during heat treatment to generate the superconductor. The Cu—Ti compound functions as reinforcement, however, there is a problem that although it is strong against tensile strain, it is weak to bending strain. In the present exemplary embodiment of the invention, in consideration of effect to the compound superconducting wire, preferably Nb, Ta, V, W, Mo, or Hf, which do not exhibit ferromagnetic properties, is employed as the material configuring the reinforcement filaments 1, and more preferably Nb, Ta, or V is employed from the viewpoint of workability.

As an alloy consisting of metals selected from the aforementioned group, an Nb—Ta alloy is preferable from the viewpoint of having excellent composite making characteristics with copper or a copper alloy. As an alloy consisting of copper and a metal selected from the aforementioned group, a Cu—Nb alloy, or a Cu—V alloy is preferable from the viewpoint of having excellent composite making characteristics with copper or a copper alloy.

Note that the above "do not readily form a solid solution with Cu" means that the metal or alloy configuring the reinforcement filaments 1 forms a solid solution with Cu at less than 1 at % at the heat treatment temperature when forming the compound superconductor (for example at 600° C. or above).

As stated above, intermetallic compounds can be suppressed from being contained in the reinforcement filaments 1 within the reinforcement bundle 5 by forming the reinforcement bundle 5 in which plural reinforcement filaments 1, mainly containing a metal material not readily forming a solid solution with Cu, are embedded in the stabilizer 2 formed at the outer peripheries of the reinforcement filaments 1, and by further having the stabilizing layer 3 at the outer periphery of the reinforcement bundle 5. As a result, a high strength reinforcement member can be formed that is strong to both tensile strain and bending strain.

In particular, due to forming the stabilizing layer 3 at the outer periphery of the reinforcement bundle 5, and making reinforcement element 4 internally configured only from the reinforcement bundle 5 and the stabilizing layer 3, when generating the compound superconductor disposed to the outside of the stabilizing layer 3, the metal material (for example Sn or Al) included in the compound superconductor and the reinforcement filaments 1 do not readily form intermetallic compounds, enabling a high strength reinforcement member to be formed.

In cases in which the compound superconductor 11 includes Sn, Al, or the like, a diffusion prevention layer (configured, for example, from Nb or Ta) may be included between the compound superconductor 11 and the reinforcement portion 12. Including a diffusion prevention layer between the compound superconductor 11 and the reinforcement portion 12 is preferable due to exhibiting the advantageous effect of making the residual resistivity ratio of the reinforcement portion 12 even larger.

The stabilizer 2, the stabilizing layer 3, and the stabilizing outermost layer 13 may be configured mainly containing copper or a copper alloy. "Mainly containing" with reference to the stabilizer 2, the stabilizing layer 3, the stabilizing outermost layer 13, and the like, means that unavoidable impurities may be contained. Examples of unavoidable impurities here include O, Fe, S, and Bi.

From the viewpoint of reducing the occupancy ratio of stabilizing material to be composited with the compound superconductor in order to increase the current density per compound superconducting wire, the residual resistivity ratio is preferably 100 or greater, and is more preferably 200 or greater. The residual resistivity ratio may be appropriately set by adjusting the amount of impurities in the copper and the composition of copper alloy in the stabilizing material.

The equivalent diameter of the reinforcement filaments 1 is preferably 0.3 µm or lower in order to obtain sufficient strength. The equivalent diameter of the reinforcement filaments 1 is, moreover, preferably 0.03 µm or greater. When the equivalent diameter of the reinforcement filaments 1 is 0.03 µm or greater, then wire breakage in the length direction when worked is suppressed, and strength uniformity is obtained in the length direction. From 0.04 µm to 0.16 µm is more preferable.

Note that the equivalent diameter $d_{f1}$ of the reinforcement filaments 1 is defined according to the following equation.

$$d_{f1} = d_1 \sqrt{\frac{X_1}{100 N_{f1}(1 + \lambda_{t1})}}$$

Wherein, $N_{f1}$ is the total number of reinforcement filaments 1 inside the reinforcement portion 12, $\lambda_{t1}$ is the proportion of cross-section area occupied by the reinforcement filaments 1 in the reinforcement portion 12, $X_1$ is the volume occupancy ratio (%) of the reinforcement portion 12 in the compound superconducting wire 10, and $d_1$ is the diameter of the compound superconducting wire 10.

The proportion occupied by the reinforcement filaments 1 in the reinforcement element 4 (volume occupancy ratio) is preferably from 10% to 50%. When the volume occupancy ratio is 10% or greater, sufficient strength is obtained, and when 50% or less, the reinforcement element 4 is readily processed, and the residual resistivity ratio can be suppressed from becoming too small.

The volume occupancy ratio of the reinforcement filaments in the reinforcement element may be derived by removing copper from a sample using nitric acid so as to extract only the reinforcement filaments, and then using the respective weights.

As the compound superconductor 11, for example, a metal compound superconductor formed of $Nb_3Sn$ or $Nb_3Al$ may be employed; however, there is no limitation thereto. In particular, a particularly significant effect can be obtained by employing a compound superconductor that is weak to strain in the length direction.

Detailed explanation next follows regarding a manufacturing method of the compound superconducting wire 10, with reference to FIG. 2 to FIG. 4. FIG. 2 is a manufacturing process flow of the compound superconducting wire 10, with FIG. 3A to FIG. 3D being process diagrams of a reinforcement precursor for forming the compound superconducting wire 10, and FIG. 4 is a configuration diagram of a reinforced compound superconductor precursor for forming the compound superconducting wire 10.

The manufacturing method of the compound superconducting wire 10 includes a process (S101) of forming a reinforcement primary element wire 102 for constituting the reinforcement filament 1, a process (S102) of forming a reinforcement secondary element wire 104 for constituting the reinforcement element 4, a process (S103) of forming a reinforced compound superconductor precursor 116 for compositing the compound superconductor 11 and the reinforcement portion 12, and a process (S104) of making a compound superconductor by heat treating the reinforced compound superconductor precursor 116 formed at process S103.

Reinforcement Primary Element Wire Forming

Figure 3A:
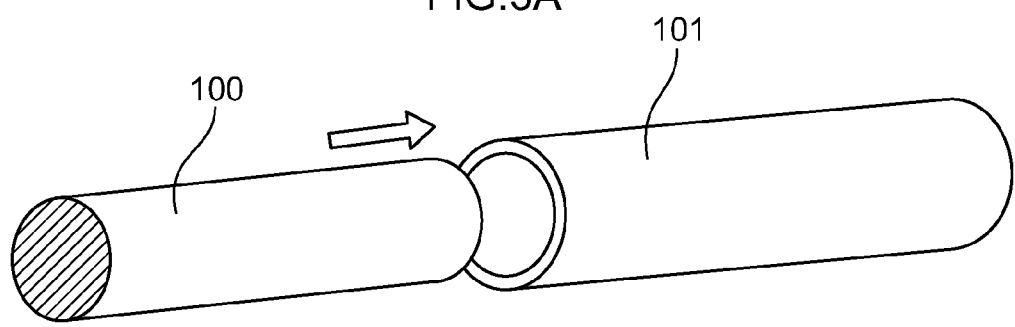
FIG. 3A is a process diagram of a reinforcement precursor for forming a compound superconducting wire of the invention.
Figure 3B:
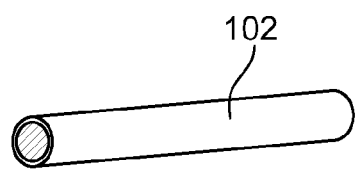
FIG. 3B is a process diagram of a reinforcement precursor for forming a compound superconducting wire of the invention.

In the process (S101) of forming the reinforcement primary element wire 102 to configure the reinforcement filament 1, as illustrated in FIG. 3A, a reinforcement element rod 100 formed of a material for constituting the reinforcement filament 1 is inserted into a primary stabilizing tube 101 formed of a material for constituting the stabilizer 2. Wire drawing is then performed to form the reinforcement primary element wire 102, as illustrated in FIG. 3B.

Wire drawing of the primary stabilizing tube 101 into which the reinforcement element rod 100 has been inserted (referred to below as primary billet) may be performed by repeatedly performing wire drawing after a primary billet extrusion process. Prior to extruding, the primary billet may be subjected to hot isostatic pressing (HIP) and external machining.

Reinforcement Secondary Element Wire Forming

Figure 3C:
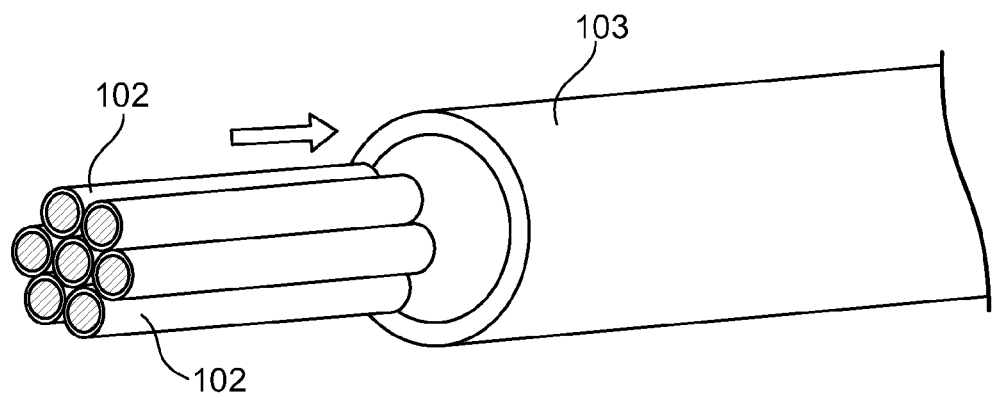
FIG. 3C is a process diagram of a reinforcement precursor for forming a compound superconducting wire of the invention.
Figure 3D:
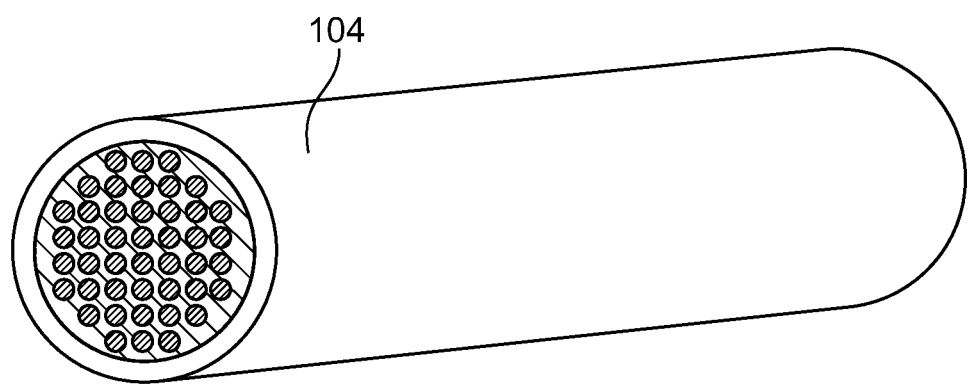
FIG. 3D is a process diagram of a reinforcement precursor for forming a compound superconducting wire of the invention.

Next, as illustrated in FIG. 3C, a plurality of the reinforcement primary element wires 102 formed at S101 are inserted into a secondary stabilization tube 103 formed of a material for constituting the stabilizing layer 3. Wire drawing is then performed to form a reinforcement secondary element wire 104, as illustrated in FIG. 3D.

The wire drawing performed on the secondary stabilization tube 103 into which a plurality of the reinforcement primary element wires 102 have been inserted (referred to below as a secondary billet) may be performed by repeatedly performing wire drawing after subjecting the secondary billet to hot isostatic pressing (HIP), external machining, and extruding.

Reinforced Compound Superconductor Precursor Forming

Forming the reinforced compound superconductor precursor to form the compound superconductor 11 may be achieved by using a known method. Explanation follows regarding an example of a manufacturing method of a metal compound superconductor formed of Nb$_3$Sn by a bronze process.

As illustrated in FIG. 4, first a circular cylinder shaped Nb ingot 110 is inserted inside a CuSn bronze tube 111, this is then extruded, and wire drawing is performed whilst performing process annealing, so as to form a compound superconductor precursor 112. Then a diffusion prevention layer 113 is disposed at the inside of an outermost layer stabilization tube 114 formed of a material for constituting the stabilizing outermost layer 13, a plurality of the compound superconductor precursors 112 are inserted inside the diffusion prevention layer 113, and the reinforcement secondary element wires 104 are inserted between the diffusion prevention layer 113 and the outermost layer stabilization tube 114, so as to form a compound superconductor forming billet 115. The compound superconductor forming billet 115 is then extruded, and wire drawn while performing process annealing, so as to form a reinforced compound superconductor precursor 116.

A secondary reinforced compound superconductor precursor may also be formed by additionally twisting together reinforced compound superconductor precursors 116, or the reinforced compound superconductor precursor 116 and a rod (Cu rod) formed of a stabilizing material.

Compound Superconductor Making

A Nb$_3$Sn compound superconductor is made by performing reaction heat treatment of the reinforced compound superconductor precursor 116 or of the secondary reinforced compound superconductor precursor, to manufacture the compound superconducting wire 10. The heat treatment employed here to make the Nb$_3$Sn compound superconductor is generally performed at a temperature from 550° C. to 700° C. for a duration of from 100 hours to 300 hours.

The manufacturing method for the Nb$_3$Sn superconductor may include heat treatment to make the compound superconductor, and in addition to bronze process, various manufacturing methods may be employed, such as internal diffusion methods. In cases in which an internal diffusion method is applied, heat treatment to diffuse Sn into the copper for bronzing may, for example, be performed at a temperature of from 210° C. to 340° C. for a duration of from 50 hours to 100 hours, and needs to be performed prior to the heat treatment to generate the Nb$_3$Sn compound superconductor. However, in cases in which Nb$_3$Al is employed as the compound superconductor, the heat treatment to make the Nb$_3$Al is, for example, performed at a temperature in the vicinity of 750° C. for a duration of about 50 hours.

Figure 5:
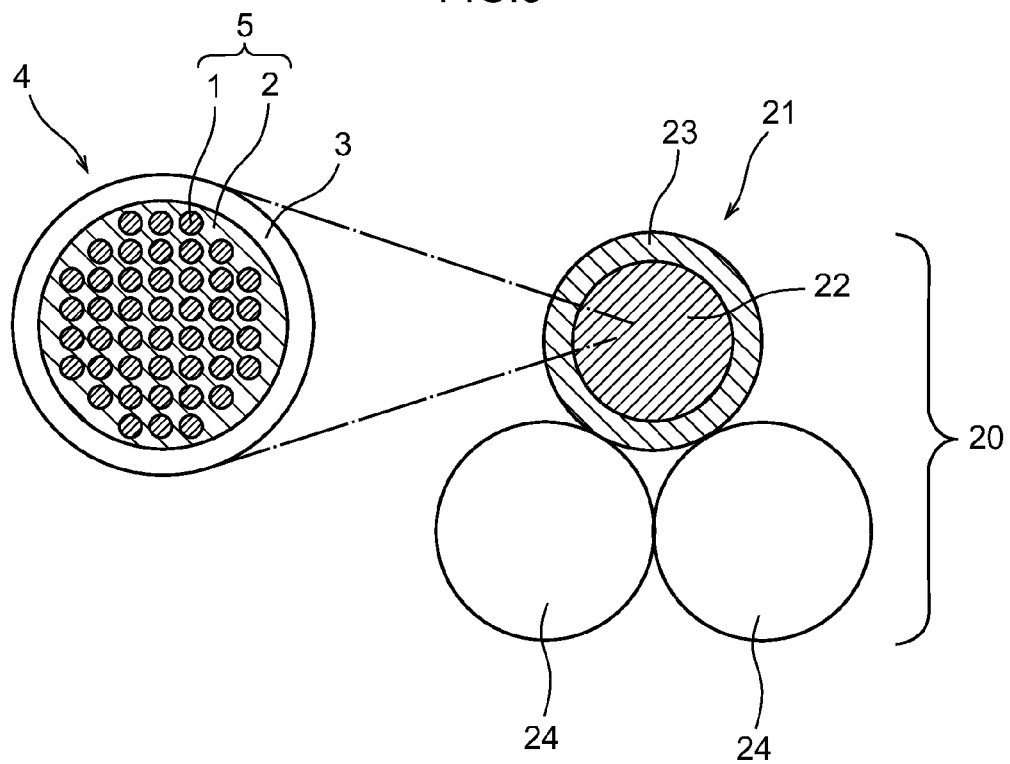
FIG. 5 is a diagram illustrating a cross-section structure of a compound superconducting wire according to another exemplary embodiment of the invention.

FIG. 5 is a diagram illustrating a cross-section structure of a compound superconducting wire 20 according to another exemplary embodiment of the invention. In the compound superconducting wire 20, a reinforcement wire 21 and compound superconducting element wires 24 including compound superconductors 11 (not illustrated in the drawings) are twisted together and composited. In the reinforcement wire 21, a stabilizing outermost layer 23 is disposed around the outer periphery of the reinforcement portion 22. The reinforcement portion 22 is formed of an assembly of plural reinforcement elements 4, in each of which plural reinforcement filaments 1 are disposed in a stabilizer 2 and further a stabilizing layer 3 is disposed at the outer periphery thereof.

The equivalent diameter of the reinforcement filaments 1 is preferably 0.3 μm or less in order to obtain sufficient strength. The equivalent diameter of the reinforcement filaments 1 is moreover preferably 0.03 μm or greater. When the equivalent diameter of the reinforcement filaments 1 is 0.03 μm or greater, then wire breakage in the length direction when worked is suppressed, and strength uniformity is obtained in the length direction. From 0.04 μm to 0.16 μm is more preferable. Note that the equivalent diameter $d_{f2}$ of the reinforcement filaments 1 is defined according to the following equation.

$$d_{f2} = d_2 \sqrt{\frac{X_2}{100 N_{f2}(1 + \lambda_{t2})}}$$

Wherein, $N_{f2}$ is the total number of reinforcement filaments 1 inside the reinforcement portion 22, $\lambda_{t2}$ is the proportion of cross-section area occupied by the reinforcement filaments 1 in the reinforcement portion 22, $X_2$ is the occupancy ratio (%) of the reinforcement portion 22 in the reinforcement wire 21, and $d_2$ is the diameter of the reinforcement wire 21.

Figure 6A:
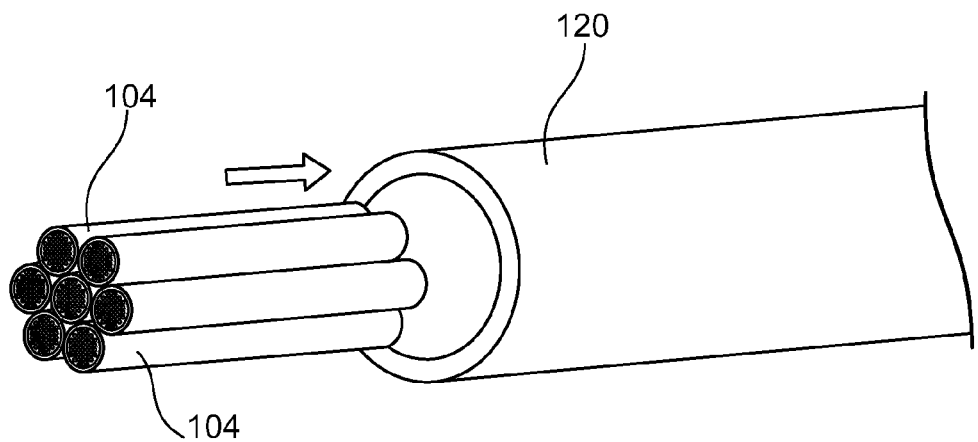
FIG. 6A is a configuration diagram of a reinforced compound superconductor precursor for forming another compound superconducting wire of the invention.
Figure 6B:
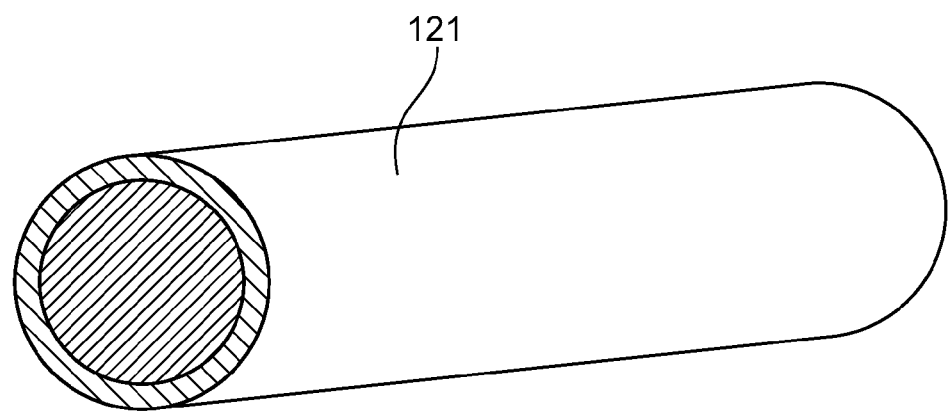
FIG. 6B is a configuration diagram of a reinforced compound superconductor precursor for forming another compound superconducting wire of the invention.
Figure 6C:
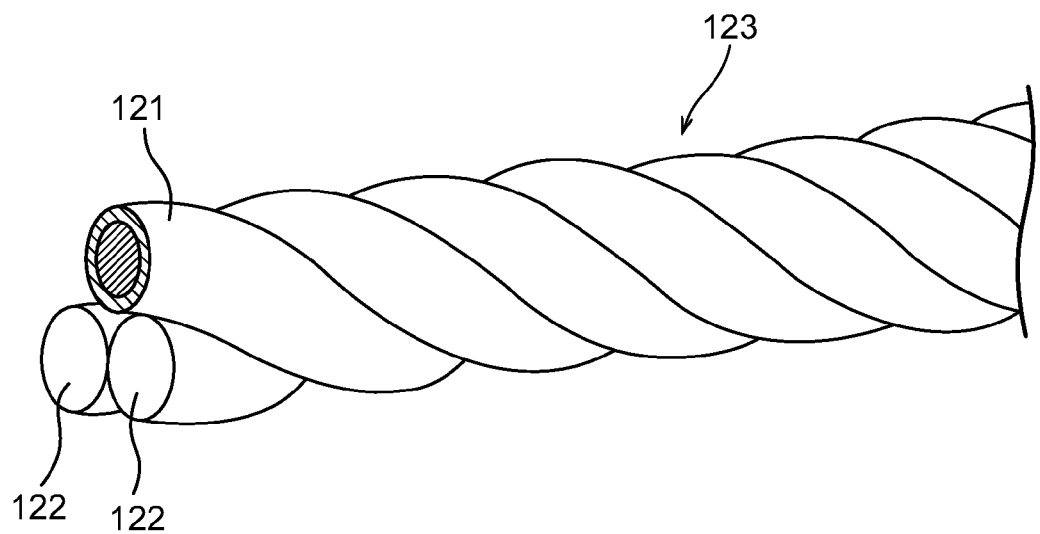
FIG. 6C is a configuration diagram of a reinforced compound superconductor precursor for forming another compound superconducting wire of the invention.

Detailed explanation next follows regarding a manufacturing method of the compound superconducting wire 20, with reference to FIG. 2, FIG. 3A to FIG. 3D, and FIG. 6A to FIG. 6C. FIG. 6A to FIG. 6C are configuration diagrams of a reinforced compound superconductor precursor for forming the compound superconducting wire 20.

The manufacturing method of the compound superconducting wire 20 includes a process (S201) of forming a reinforcement primary element wire 102 for constituting the reinforcement filament 1, a process (S202) of forming a reinforcement secondary element wire 104 for constituting the reinforcement element 4, a process (S203) of forming a reinforced compound superconductor precursor 123 for compositing the compound superconductor 11 and the reinforcement portion 22, and a process (S204) of making a compound superconductor by heat treating the reinforced compound superconductor precursor 123 formed at process S203.

Note that in the manufacturing method of the compound superconducting wire 20, the process (S201) of forming the reinforcement primary element wire 102, and the process (S202) of forming the reinforcement secondary element wire 104, are the same as in the manufacturing method of the compound superconducting wire 10, and explanation thereof is therefore omitted.

Reinforced Compound Superconductor Precursor Forming

As illustrated in FIG. 6A, a plurality of the reinforcement secondary element wires 104 obtained by the process (S202) of forming the reinforcement secondary element wire 104 are inserted into an outermost layer stabilization tube 120 for constituting the stabilizing outermost layer 23. A reinforcement tertiary element wire 121, as illustrated in FIG. 6B, is then formed by wire drawing.

One reinforcement tertiary element wire 121 obtained, and two compound superconductor precursors 122 that will constitute the compound superconductors 11 after heat treatment, are twisted together as illustrated in FIG. 6C to form the reinforced compound superconductor precursor 123.

Although there is no particular limitation on the compound superconductor precursors 122, explanation is given here of an example of a manufacturing method of a metal compound superconductor formed of $Nb_3Sn$ by a bronze process.

First, a circular cylinder shaped Nb ingot is inserted inside a CuSn bronze tube, this is then extruded, and wire drawing is performed whilst performing process annealing, so as to form a compound superconductor precursor. Then a plurality of the compound superconductor precursors are inserted inside an outermost layer stabilization Cu tube to form a compound superconductor forming billet. The compound superconductor forming billet is then extruded, and wire drawn while performing process annealing, so as to form the compound superconductor precursor 122.

Compound Superconductor Making

The compound superconductor 11 is made by performing reaction heat treatment of reinforced compound superconductor precursor 123, to manufacture the compound superconducting wire 20. The heat treatment employed here to make the $Nb_3Sn$ compound superconductor is performed at, for example, a temperature from 550° C. to 700° C. for a duration of from approximately 100 hours to approximately 300 hours.

The reinforced compound superconductor precursor 116 employed during manufacture of the compound superconducting wire 10 may be used in place of the compound superconductor precursor 122 in the reinforced compound superconductor precursor 123. When the reinforced compound superconductor precursor 116 is applied in the reinforced compound superconductor precursor 123, the strength difference between the compound superconducting element wires 24 and the reinforcement wire 21 constituting the compound superconducting wire 20 is smaller, and this is preferable from the viewpoints of not only improving workability during twisting before making the compound superconductor 11, but also, after heat treatment to make the compound superconductor 11, of making the cooling strain and electromagnetic force received during conduction more uniform inside the compound superconducting wire 20, raising conduction stability.

The disclosure of Japanese Patent Application No. 2012-090829 is incorporated herein by reference in its entirety.

All publications, patent applications, and technical standards mentioned in this specification are herein incorporated by reference to the same extent as if each individual publication, patent application, or technical standard was specifically and individually indicated to be incorporated by reference.

EXAMPLES

More detailed explanation follows regarding Examples. The invention is not limited by these Examples.

Examples 1 to 6

A reinforcement element rod (pure Nb rod, diameter 22.8 mm $\phi$) was inserted into a primary stabilization tube (oxygen free copper tube, external diameter 46 mm $\phi$, internal diameter 23.1 mm $\phi$) (primary billet), and then after extruding, wire drawing and surface layer removal were performed repeatedly, whereby a reinforcement primary element wire of diameter 0.6 mm $\phi$ was formed.

3700 of the obtained reinforcement primary element wires were bundled together and inserted into a secondary stabilization tube (oxygen free copper tube) of external diameter 52 mm $\phi$, and internal diameter of 42 mm $\phi$ (secondary billet). Then, after performing HIP, external machining, and extruding, wire drawing and surface layer removal were performed repeatedly, and a reinforcement secondary element wire was formed with the diameter listed in Table 1.

Nb ingots (pure Nb rods) of 5.5 mm $\phi$ were inserted into the holes of a bronze (Cu-14 wt % Sn) rod (CuSn bronze tube) with an external diameter of 46 mm $\phi$ having 19 holes of internal diameter 5.8 mm $\phi$, and then after extruding, wire drawing and surface layer removal were performed repeatedly, to form a compound superconductor precursor that was a 19-core Nb hexagonal element wire with a width across flats of 1.4 mm.

367 of the obtained compound superconductor precursors were bundled together, the periphery of which was wrapped in 7 layers of 0.1 mm thickness Nb sheet as a diffusion prevention layer, and in a state in which the number listed in Table 1 of the obtained reinforcement secondary element wires were disposed at the periphery thereof, the bundled compound superconductor precursors were inserted into an outermost layer stabilization tube (oxygen free copper tube) of external diameter 52 mm $\phi$ and internal diameter 42 mm $\phi$, to form a compound superconductor forming billet.

The obtained compound superconductor forming billet was subjected to HIP, external machining, and extruding, and then wire drawing, annealing, and surface layer removal were performed repeatedly to form a reinforced compound superconductor precursor of external diameter 0.8 mm $\phi$.

Heat treatment to make an $Nb_3Sn$ compound superconductor was performed on the obtained reinforced compound superconductor precursor at 670° C. for a duration of 96 hours, to obtain the compound superconducting wire of Examples 1 to 6 with the structure illustrated in FIG. 1.

The obtained compound superconducting wire had an occupancy ratio of a reinforcement portion of 35%, an occupancy ratio of a non-stabilizing portion (compound superconductor portion+diffusion prevention layer) of 45%, a stabilization portion occupancy ratio of 20%, a volume ratio of Nb in the reinforcement element of 27%, and a volume ratio of Nb in the reinforcement portion of 20%. The equivalent diameter of the reinforcement filaments in the reinforcement portion of the compound superconducting wire obtained was as listed in Table 1.

The "occupancy ratio" referred to above is the proportion of area in a cross-section, and the occupancy ratio of each of the portions (the reinforcement portion, the non-stabilizing portion, and the stabilization portion) in the compound superconducting wire may be derived from the proportion of cross-sectional area thereof in a captured cross-section image.

TABLE 1

|  | Reinforcement Secondary Element Wire Diameter (mm φ) | Number of Reinforcement Secondary Element Wires | Equivalent Diameter of Reinforcement Filaments (μm) |
|---|---|---|---|
| Example 1 | 0.22 | 14016 | 0.029 |
| Example 2 | 0.30 | 7538 | 0.040 |
| Example 3 | 1.00 | 678 | 0.133 |
| Example 4 | 1.50 | 302 | 0.200 |
| Example 5 | 2.10 | 154 | 0.280 |
| Example 6 | 2.32 | 126 | 0.309 |

Examples 7 to 13

A reinforcement element rod (pure Nb rod) with the diameter listed in Table 2 was inserted into a primary stabilization tube (oxygen free copper tube, external diameter 46 mm φ) with the internal diameter as listed in Table 2 (primary billet), and then after extruding, wire drawing and surface layer removal were performed repeatedly to form a reinforcement primary element wire of diameter 0.6 mm φ.

3700 of the obtained reinforcement primary element wires were bundled together and inserted into a secondary stabilization tube (oxygen free copper tube) of external diameter 52 mm φ and internal diameter of 42 mm φ (secondary billet). Then, after performing HIP, external machining, and extruding, wire drawing and surface layer removal were performed repeatedly, and a reinforcement secondary element wire was formed with the diameter listed in Table 2.

Nb ingots (pure Nb rods) of 5.5 mm φ were inserted into the holes of a bronze (Cu-14 wt % Sn) rod (CuSn bronze tube) with an external diameter of 46 mm φ having 19 holes of internal diameter 5.8 mm φ, and then after extruding, wire drawing and surface layer removal were performed repeatedly, to form a compound superconductor precursor that was a 19-core Nb hexagonal element wire with a width across flats of 1.4 mm.

367 of the obtained compound superconductor precursors were bundled together, the periphery of which was wrapped in 7 layers of 0.1 mm thickness Nb sheet as a diffusion prevention layer, and in a state in which the number listed in Table 2 of the obtained reinforcement secondary element wires were disposed at the periphery thereof, the bundled compound superconductor precursors were inserted into an outermost layer stabilization tube (oxygen free copper tube) of external diameter 52 mm φ and internal diameter 42 mm φ, to form a compound superconductor forming billet.

The obtained compound superconductor forming billet was subjected to HIP, external machining, and extruding, and then wire drawing, annealing, and surface layer removal were performed repeatedly to form a reinforced compound superconductor precursor of external diameter 0.8 mm φ.

In order to make an $Nb_3Sn$ compound superconductor, heat treatment was performed to the obtained reinforced compound superconductor precursor at 670° C. for a duration of 96 hours, to obtain the compound superconducting wire of Examples 7 to 13 with the structure illustrated in FIG. 1.

The obtained compound superconducting wire had a reinforcement portion occupancy ratio of 35%, an occupancy ratio of the non-stabilizing portion (compound superconductor portion+diffusion prevention layer) of 45%, an occupancy ratio of a stabilization portion was 20%, and an equivalent diameter of the reinforcement filaments in the reinforcement portion of 0.08 μm. The volume ratio of the Nb in the reinforcement element of the obtained compound superconducting wire and the volume ratio of the Nb in the reinforcement portion were as listed in Table 2.

TABLE 2

|  | Primary Stabilization Tube Internal Diameter (mm φ)) | Reinforcement element Rod Diameter (mm φ) | Reinforcement secondary element wire Diameter (mm φ)) | Reinforcement secondary element wires (Number) | Nb volume ratio (%) | |
|---|---|---|---|---|---|---|
|  |  |  |  |  | Reinforcement element | Reinforcement Portion |
| Example 7 | 14.8 | 14.5 | 1.34 | 378 | 12 | 5 |
| Example 8 | 18.4 | 18.1 | 0.85 | 939 | 17 | 10 |
| Example 9 | 23.1 | 22.8 | 0.60 | 1884 | 27 | 20 |
| Example 10 | 27.0 | 26.7 | 0.49 | 2825 | 37 | 30 |
| Example 11 | 30.3 | 30.0 | 0.43 | 3756 | 47 | 40 |
| Example 12 | 33.3 | 33.0 | 0.38 | 4698 | 57 | 50 |
| Example 13 | 34.8 | 34.5 | 0.36 | 5177 | 62 | 55 |

Examples 14, 15

A reinforcement element rod (pure Nb rod, diameter 22.8 mm φ) was inserted into a primary stabilization tube (oxygen free copper tube, external diameter 46 mm φ, internal diameter 23.1 mm φ) (primary billet). Then, after extruding, wire drawing and surface layer removal were performed repeatedly to form a reinforcement primary element wire of diameter 0.6 mm φ.

3700 of the obtained reinforcement primary element wires were bundled together and inserted into a secondary stabilization tube (oxygen free copper tube) of external diameter 52 mm φ and internal diameter of 42 mm φ (secondary billet). Then, after performing HIP, external machining, and extruding, wire drawing and surface layer removal were performed repeatedly, to form a reinforcement secondary element wire with a diameter of 0.60 mm φ.

4312 of the obtained reinforcement secondary element wires were inserted into an outermost layer stabilization tube (oxygen free copper tube, external diameter 52 mm ϕ, internal diameter 42 mm ϕ), and then after performing HIP, external machining, and extruding, wire drawing, annealing, and surface layer removal were performed repeatedly, to form a reinforcement tertiary element wire with an external diameter of 0.8 mm ϕ.

One reinforcement tertiary element wire obtained and two compound superconductor precursors that become the compound superconductors after heat treatment (diameter 0.80 mm ϕ) were twisted together at a pitch of 45 mm to form a reinforced compound superconductor precursor. Heat treatment to make an $Nb_3Sn$ compound superconductor was performed on the obtained reinforced compound superconductor precursor at 670° C. for a duration of 96 hours, to obtain the compound superconducting wire of Examples 14, 15 with the structure illustrated in FIG. 5. The equivalent diameter of the reinforcement filaments formed inside the reinforcement portion of the reinforcement wire at this stage was 0.08 μm, the volume ratio of the Nb in the reinforcement element was 27%, and the volume ratio of Nb in the reinforcement portion was 20%. Note that the occupancy ratio of the reinforcement portion in the reinforcement wire was 80%, and the occupancy ratio of the stabilizing outermost layer was 20%.

In Example 14, the reinforced compound superconductor precursor formed in Example 9 was employed as the compound superconductor precursor. A conventional compound superconductor precursor not composited with reinforcement was employed as the compound superconductor precursor of Example 15.

The conventional compound superconductor precursor not composited with reinforcement employed in Example 15 was formed in the following manner.

The compound superconductor precursor was formed in the same manner as in Examples 1 to 13. 367 of the obtained compound superconductor precursors were bundled together, the periphery of which was wrapped in 7 layers of 0.1 mm thickness Nb sheet as a diffusion prevention layer, and inserted into an outermost layer stabilization tube (oxygen free copper tube) of external diameter 52 mm ϕ and internal diameter 30.5 mm ϕ, to form a compound superconductor forming billet.

The obtained compound superconductor forming billet was subjected to HIP, external machining, and extruding, and then wire drawing, annealing, and surface layer removal were performed repeatedly to form a conventional compound superconductor precursor of external diameter 0.8 mm ϕ.

The compound superconducting wire obtained in the Example 14 included reinforcement portion in both the reinforcement wire and the compound superconducting element wires, and the same reinforcement filaments as those of Example 9 were present in the compound superconducting element wires.

The compound superconducting wire obtained in the Example 15 included reinforcement portion in only the reinforcement wire, there was no reinforcement portion in the compound superconducting element wires, and occupancy ratio of the non-stabilizing portion (compound superconductor portion+diffusion prevention layer) in the compound superconducting element wires was 45%, and the occupancy ratio of the stabilizing outermost layer was 55%.

Example 16

Two reinforced compound superconductor precursors, which were the same as that formed in Example 9, were employed, and twisted together with one oxygen free copper wire (diameter 0.80 mm ϕ) at a pitch of 45 mm to form a reinforced compound superconductor precursor.

Heat treatment to make an $Nb_3Sn$ compound superconductor was performed on the obtained reinforced compound superconductor precursor at 670° C. for a duration of 96 hours, to obtain the compound superconducting wire of Example 16 consisting of two compound superconducting element wires and one stabilization wire.

The compound superconducting wire obtained in Example 16 included reinforcement portion in only the compound superconducting element wires, and there was no reinforcement portion in the stabilization wire. The same reinforcement filaments as those of Example 9 were present in the compound superconducting element wires.

Comparative Example 1

A Comparative Example 1 was formed in which a Cu-20 vol % Nb alloy according to an in-situ method and an $Nb_3Sn$ compound superconductor were composited.

Using a CaO crucible and a vacuum high frequency melting method, a Cu-20 vol % Nb alloy with a diameter of 27 mm was manufactured, which was then subjected to repeated wire drawing so as to have a diameter of 8 mm ϕ, and further subjected to external machining so as to have a trapezoidal shape with an upper base of 5 mm, lower base of 7 mm, and height of 5 mm, thereby obtaining the reinforcement precursor of Comparative Example 1.

The same compound superconductor precursor as in the Examples 1 to 13 was formed as the reinforced compound superconductor precursor of Comparative Example 1.

367 of the obtained compound superconductor precursors were bundled together, the periphery of which was wrapped in 7 layers of 0.1 mm thickness Nb sheet as a diffusion prevention layer, and in a state in which 18 of the obtained reinforcement precursors were disposed at the periphery thereof, the bundled compound superconductor precursors were inserted into an outermost layer stabilization tube (oxygen free copper tube) of external diameter 52 mm ϕ and internal diameter 42 mm ϕ, to form a compound superconductor forming billet.

After performing HIP, external machining, and extruding on the obtained compound superconductor forming billet, wire drawing, annealing, and surface layer removal were performed repeatedly to form a reinforced compound superconductor precursor of external diameter 0.8 mm ϕ.

In order to make an $Nb_3Sn$ compound superconductor, heat treatment was performed to the obtained reinforced compound superconductor precursor at 670° C. for a duration of 96 hours, and the compound superconducting wire of Comparative Example 1 was obtained.

At this stage, the occupancy ratio of the reinforcement portion was 35%, the occupancy ratio of the non-stabilizing portion (compound superconductor portion+diffusion prevention layer) was 45%, the stabilization portion occupancy ratio was 20%, and the volume ratio of Nb in the reinforcement precursor was 20%; however, the diameter of the reinforcement filaments (Nb filaments) within the reinforcement precursor could not be controlled and was unclear.

Comparative Example 2

A reinforcement element rod (pure Nb rod, diameter 22.8 mm ϕ) was inserted into a primary stabilization tube (oxygen free copper tube, external diameter 46 mm ϕ, internal diameter 23.1 mm ϕ) (primary billet), and after extruding, wire drawing and surface layer removal were performed repeatedly, to form a reinforcement primary element wire of hexagonal shape with a width across flats of 1.4 mm as reinforcement of a Comparative Example 2.

The same compound superconductor precursor as those of Examples 1 to 13 was formed as the reinforced compound superconductor precursor of Comparative Example 2. 367 of the obtained compound superconductor precursors were bundled together, and the periphery thereof was wrapped in 7 layers of 0.1 mm thickness Nb sheet as a diffusion prevention layer. Then in a state in which 1860 of the obtained reinforcement primary element wires were disposed at the periphery thereof, the bundled compound superconductor precursors were inserted into an outermost layer stabilization tube (oxygen free copper tube) of external diameter 52 mm φ and internal diameter 42 mm φ, to form a compound superconductor forming billet.

After performing HIP, external machining, and extruding on the obtained compound superconductor forming billet, wire drawing, annealing, and surface layer removal were performed repeatedly to form a reinforced compound superconductor precursor of external diameter 0.8 mm φ.

In order to make an $Nb_3Sn$ compound superconductor, heat treatment was performed to the obtained reinforced compound superconductor precursor at 670° C. for a duration of 96 hours, and the compound superconducting wire of Comparative Example 2 was obtained.

Comparative Example 3

A conventional compound superconducting wire not composited with reinforcement was formed as the Comparative Example 3.

The same compound superconductor precursor as those of Examples 1 to 13 was formed. 367 of the obtained compound superconductor precursors were bundled together, the periphery of which was wrapped in 7 layers of 0.1 mm thickness Nb sheet as a diffusion prevention layer, and inserted into an outermost layer stabilization tube (oxygen free copper tube) of external diameter 52 mm φ and internal diameter 30.5 mm φ, to form a compound superconductor forming billet.

The obtained compound superconductor forming billet was subjected to HIP, external machining, and extruding, and then wire drawing, annealing, and surface layer removal were performed repeatedly to form a conventional compound superconductor precursor of external diameter 0.8 mm φ. Heat treatment to make an $Nb_3Sn$ compound superconductor was performed at 670° C. for a duration of 96 hours, to form a conventional compound superconducting wire not composited with reinforcement.

Evaluation

The compound superconducting wires obtained in the Examples and Comparative Examples were evaluated for strength characteristics, low temperature characteristics, and workability. The obtained results are illustrated in Table 3.

Each of the evaluations was performed as follows.

(1) Strength Characteristics

A 0.2% proof stress measurement was performed at room temperature. The 0.2% proof stress measurement was performed with a sample length of 200 mm, a distance between grippers of 100 mm, and a distance between elongation gauge marks of 50 mm, with other conditions based on JIS Z 2241 (2011). The 0.2% proof stress at lower temperature (4.2 K) is about 10% higher than at room temperature.

(2) Workability

The number of wire breakage generated per km of formed compound superconducting wire was measured.

(3) Low Temperature Characteristics

Critical Current Ic (Per Compound Superconducting Wire)

In liquid helium (temperature 4.2K), conduction was performed in the compound superconducting wire in an external magnetic field of 13T, the generated voltage was measured by a 4 terminal method, and the current value (critical current Ic) at which an electrical field of 10 μV/m was generated was measured. Note that in Examples 14 to 16, due to incorporating two compound superconducting element wires, the value listed is ½ the measured value, so as to give the Ic value per compound superconducting wire.

Residual Resistivity Ratio (RRR)

The residual resistivity ratio was computed by dividing the resistance value measured at a temperature of 293K by the resistance value measured at a temperature of 20K.

(4) Overall Evaluation

The results obtained by the evaluations described above were then evaluated to give an overall evaluation result.

A: pass for all conditions of Ic being 125 A or greater, 0.2% proof stress being 250 MPa or greater, RRR being 150 or greater, and number of wire breakage being 0.

B: pass for all conditions of Ic being 120 A or greater, 0.2% proof stress being 200 MPa or greater, RRR being 100 or greater, and number of wire breakage being 0.

C: pass for all conditions of Ic being 120 A or greater, 0.2% proof stress exceeding 150 MPa, RRR being 100 or greater, and number of wire breakage being 1 or greater.

D: pass for any one condition out of Ic being less than 120 A, 0.2% proof stress being 150 MPa or less, or RRR being less than 100.

TABLE 3

| | Workability Number of Wire breakage/km | Low Temperature Characteristics Ic (A) | | Strength Characteristics 0.2% proof stress (MPa) | Overall Evaluation |
|---|---|---|---|---|---|
| | | | RRR | | |
| Example 1 | 1 | 120 | 130 | 170 | C |
| Example 2 | 0 | 125 | 140 | 230 | B |
| Example 3 | 0 | 125 | 150 | 245 | B |
| Example 4 | 0 | 120 | 150 | 240 | B |
| Example 5 | 0 | 120 | 150 | 230 | B |
| Example 6 | 0 | 120 | 150 | 220 | B |
| Example 7 | 1 | 120 | 190 | 200 | C |
| Example 8 | 0 | 120 | 170 | 230 | B |
| Example 9 | 0 | 125 | 150 | 250 | A |
| Example 10 | 0 | 125 | 140 | 270 | B |
| Example 11 | 0 | 125 | 140 | 280 | B |
| Example 12 | 0 | 125 | 130 | 290 | B |
| Example 13 | 1 | 120 | 120 | 300 | C |
| Example 14 | 0 | 125 | 180 | 260 | A |
| Example 15 | 0 | 120 | 190 | 220 | B |
| Example 16 | 0 | 120 | 190 | 200 | B |
| Comparative Example 1 | 2 | 120 | 60 | 220 | D |
| Comparative Example 2 | 1 | 115 | 160 | 200 | D |
| Comparative Example 3 | 0 | 110 | 200 | 150 | D |

It can be seen from Table 3 that Examples 1 to 16 have a significantly higher residual resistivity ratio than Comparative Example 1 (In-situ method), and have excellent workability. It can be seen that Examples 1 to 16 have a higher Ic, or higher strength characteristics than Comparative Example 2 (reinforcement portion formed by reinforcement primary element wires). Moreover, it can be seen that Examples 1 to 16 have a higher Ic and higher strength characteristics than the Comparative Example 3 (conventional compound superconducting wire).

Accordingly, the present exemplary embodiment is capable of raising the residual resistivity ratio and has excellent workability, and thus has excellent long product manufacturing stability.

It can be seen that the change in 0.2% proof stress of Examples 1 to 16 occurs due to the size and occupancy ratio of the reinforcement filaments (the Nb filaments) in the reinforcement portion. In the present exemplary embodiment, the strength of the reinforcement portion can accordingly be set by adjusting the size and occupancy ratio (volume ratio of Nb in the reinforcement elements and the volume ratio of Nb in the reinforcement portion) of the reinforcement filaments (Nb filaments) in the reinforcement portion.

Moreover, it can be seen that changes in the residual resistivity ratio of Examples 1 to 16 occur due to the size and occupancy ratio of the reinforcement filaments (Nb filaments) in the reinforcement portion.

In the present exemplary embodiment, the residual resistivity ratio of the reinforcement portion can accordingly be set by adjusting the size and occupancy ratio (volume ratio of Nb in the reinforcement elements and the volume ratio of Nb in the reinforcement portion) of the reinforcement filaments (Nb filaments) in the reinforcement portion.

In order to compare the Examples 1 to 13 and the Comparative Examples 1, 2, the occupancy ratios of all of the superconductor portions were made the same; however, in the present exemplary embodiment, the occupancy ratio of the reinforcement portion and the stabilizing layer (oxygen free copper) in the compound superconducting wire may be set smaller. Thus in the present exemplary embodiment, as a result of being able to make the occupancy ratio of the superconductor portion greater, the critical current per compound superconducting wire can be increased.

Moreover, it has been confirmed in Examples 14 to 16 that there are excellent residual resistivity ratio and strength characteristics, and high conduction stability, for all of a compound superconducting wire including a reinforcement portion in only the compound superconducting element wire (Example 16), a compound superconducting wire including a reinforcement portion as a reinforcement wire external to the compound superconducting element wires (Example 15), and a compound superconducting wire including a reinforcement portion in both the compound superconducting element wires and reinforcement wire (Example 14). In particular, significantly high strength characteristic of a 0.2% proof stress of 250 MPa or greater was exhibited by Example 14.

Note that in Examples 14 to 16, making of the compound superconductor is performed after 3 wires have been twisted together, enabling a compound superconducting wire to be achieved that has high conduction stability and strength. However, there is no limitation to a 3 strand twisted wire structure, and similar advantageous effects may be obtained by round multi-strand twisted structures, and rectangular molded twisted wires such as a Rutherford cables.

Effect of Equivalent Diameter of Reinforcement Filament

FIG. 7 is a graph illustrating a relationship between equivalent diameter of the reinforcement filaments formed in the reinforcement portion of the present exemplary embodiment and the 0.2% proof stress.

The equivalent diameter of the reinforcement filaments employed here is that of the reinforcement filaments of compound superconducting wire formed by a manufacturing method similar to that of the Example 1. However, change in the equivalent diameter was performed by changing only the diameter of the reinforcement secondary element wires and the reinforcement secondary element wires as in Examples 1 to 6. The 0.2% proof stress measurement here was performed at room temperature.

As illustrated in FIG. 7, it can be seen that the equivalent diameter of the reinforcement filaments of approximately 0.08 μm provides the highest 0.2% proof stress. Thus cases in which the equivalent diameter of the reinforcement filaments is from 0.03 μm to 0.3 μm are preferable as the 0.2% proof stress is 230 MPa or greater. Cases in which the equivalent diameter of the reinforcement filaments is from 0.04 μm to 0.16 μm are more preferable due to the 0.2% proof stress being 250 MPa or greater.

In the present examples, an $Nb_3Sn$ compound superconducting wire according to a bronze process was employed. The advantageous effects of the invention are not limited thereto, and similar advantageous effects may be obtained in $Nb_3Sn$ compound superconducting wires according to an internal diffusion method.

EXPLANATION OF THE REFERENCE NUMERALS

1 reinforcement filament
2 stabilizer
3 stabilizing layer
4 reinforcement element
5 reinforcement bundle
10, 20 compound superconducting wire
11 compound superconductor
12, 22 reinforcement portion
13, 23 stabilizing outermost layer
24 compound superconducting element wire

What is claimed is:

1. A compound superconducting wire comprising:
 a reinforcement portion including
  a plurality of reinforcement elements that each include
   a reinforcement bundle consisting of a plurality of reinforcement filaments and a stabilizer mainly containing copper or a copper alloy and formed at an outer periphery of each of the reinforcement filaments, the reinforcement filaments each mainly containing one or more metals selected from the group consisting of Nb, Ta, V, W, Mo, Fe, and Hf, an alloy consisting of two or more metals selected from the aforementioned group, or an alloy consisting of copper and one or more metals selected from the aforementioned group, and
   a stabilizing layer mainly containing copper or a copper alloy at an outer periphery of the reinforcement bundle; and
 a compound superconductor
 wherein an equivalent diameter $d_{f1}$ of the reinforcement filaments is 0.3 μm or less, and the equivalent diameter $d_{f1}$ is defined according to the following equation:

$$d_{f1} = d_1 \sqrt{\frac{X_1}{100 N_{f1}(1 + \lambda_{t1})}}$$

wherein $N_{f1}$ represents a total number of the reinforcement filaments inside the reinforcement portion, $\lambda_{r1}$ represents a proportion of a cross-section area occupied by the reinforcement filaments in the reinforcement portion, $X_1$ represents a volume occupancy ratio (%) of the reinforcement portion in the compound superconducting wire, and $d_1$ represents a diameter of the compound superconducting wire.

2. The compound superconducting wire of claim 1, wherein:
    the compound superconductor is a metal compound superconductor; and
    the compound superconducting wire includes
        a reinforced compound superconducting element wire including
            a reinforced superconducting element in which the reinforcement portion and the compound superconductor are composited into a single wire shape, and
            a stabilizing outermost layer mainly containing copper or a copper alloy and formed at an outer periphery of the reinforced superconducting element.

3. The compound superconducting wire of claim 1, wherein the equivalent diameter of the reinforcement filaments is from 0.04 μm to 0.16 μm.

4. The compound superconducting wire of claim 1, wherein the reinforcement filaments mainly contain one or more metals selected from the group consisting of Nb, Ta, and V.

5. The compound superconducting wire of claim 1, wherein a volume occupancy ratio of the reinforcement filaments in the reinforcement element is from 10% to 50%.

6. The compound superconducting wire of claim 1, wherein a reinforcement wire including the reinforcement portion and a compound superconducting element wire including the compound superconductor are twisted together.

7. The compound superconducting wire of claim 2, wherein a reinforcement wire including the reinforcement portion and the reinforced compound superconducting element wire are twisted together.

8. A manufacturing method of the compound superconducting wire of claim 1, the method comprising:
    a process of forming a reinforcement primary element wire by performing wire drawing on a reinforcement primary precursor formed by inserting a reinforcement element rod, mainly containing one or more metals selected from the group consisting of Nb, Ta, Ti, W, Mo, and Hf, an alloy consisting of two or more metals selected from the aforementioned group, or an alloy consisting of copper and one or more metals selected from the aforementioned group, into a primary stabilization tube mainly containing copper or a copper alloy;
    a process of forming a reinforcement secondary element wire by performing wire drawing on a reinforcement secondary precursor formed by inserting a plurality of the reinforcement primary element wires into a secondary stabilization tube mainly containing copper or a copper alloy;
    a process of forming a reinforced compound superconductor precursor by compositing a compound superconductor precursor for forming a compound superconductor and a plurality of the reinforcement secondary element wires; and
    a process of making a compound superconductor by heat treating the reinforced compound superconductor precursor.

9. The compound superconducting wire manufacturing method of claim 8, wherein the reinforced compound superconductor precursor has a structure in which the compound superconductor precursor and a plurality of the reinforcement secondary element wires are inserted into an outermost layer stabilization tube mainly containing copper or a copper alloy.

10. The compound superconducting wire manufacturing method of claim 8, wherein the reinforced compound superconductor precursor has a structure in which the compound superconductor precursor and a reinforcement wire precursor including a plurality of the reinforcement secondary element wires are twisted together.

* * * * *

UNITED STATES PATENT AND TRADEMARK OFFICE
CERTIFICATE OF CORRECTION

PATENT NO. : 9,711,262 B2  
APPLICATION NO. : 14/510973  
DATED : July 18, 2017  
INVENTOR(S) : Masahiro Sugimoto et al.

Page 1 of 1

It is certified that error appears in the above-identified patent and that said Letters Patent is hereby corrected as shown below:

On the Title Page

In the Assignee data at (73), Line 1:
Insert --FURUKAWA ELECTRIC CO., LTD.--

Signed and Sealed this
Third Day of October, 2017

Joseph Matal
*Performing the Functions and Duties of the*
*Under Secretary of Commerce for Intellectual Property and*
*Director of the United States Patent and Trademark Office*